(12) United States Patent
Yang et al.

(10) Patent No.: US 12,230,688 B2
(45) Date of Patent: Feb. 18, 2025

(54) MOSFET GATE ENGINEERINNG WITH DIPOLE FILMS

(71) Applicant: Applied Materials, Inc., Santa Clara, CA (US)

(72) Inventors: Yong Yang, Tengzhou (CN); Srinivas Gandikota, Santa Clara, CA (US); Steven C. H. Hung, Sunnyvale, CA (US); Mandyam Sriram, San Jose, CA (US); Jacqueline S. Wrench, San Jose, CA (US); Yixiong Yang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/667,036

(22) Filed: Feb. 8, 2022

(65) Prior Publication Data

US 2022/0254900 A1    Aug. 11, 2022

Related U.S. Application Data

(60) Provisional application No. 63/283,205, filed on Nov. 24, 2021, provisional application No. 63/147,217, filed on Feb. 8, 2021.

(51) Int. Cl.
*H01L 29/51*    (2006.01)
*H01L 29/40*    (2006.01)
(Continued)

(52) U.S. Cl.
CPC .......... *H01L 29/516* (2013.01); *H01L 29/401* (2013.01); *H01L 29/6684* (2013.01); *H01L 29/78391* (2014.09)

(58) Field of Classification Search
None
See application file for complete search history.

(56) References Cited

U.S. PATENT DOCUMENTS

| 9,082,702 B2 | 7/2015 | Lei et al. |
| 10,236,292 B1 | 3/2019 | Frougier et al. |

(Continued)

FOREIGN PATENT DOCUMENTS

| JP | 2008172209 A | 7/2008 |
| JP | 2008537359 A | 9/2008 |

(Continued)

OTHER PUBLICATIONS

"Complementary FET (CFET)", Semiconductor Engineering, https://semiengineering.com/knowledge_centers/integrated-circuit/transistors/3d/cfet/.

(Continued)

*Primary Examiner* — Xiaoming Liu
(74) *Attorney, Agent, or Firm* — Servilla Whitney LLC

(57) ABSTRACT

A metal gate stack on a substrate comprises: an interfacial layer on the substrate; a high-κ metal oxide layer on the interfacial layer, the high-κ metal oxide layer comprising a dipole region adjacent to the interfacial layer, the dipole region comprising niobium (Nb); a high-κ metal oxide capping layer on the high-κ metal oxide layer; a positive metal-oxide-semiconductor (PMOS) work function material above the high-κ metal oxide capping layer; and a gate electrode above the PMOS work function material. The dipole region is formed by driving Nb species of a Nb-based film into the high-κ metal oxide layer to form a dipole region.

10 Claims, 4 Drawing Sheets

(51) Int. Cl.
    *H01L 29/66*         (2006.01)
    *H01L 29/78*         (2006.01)

(56) References Cited

U.S. PATENT DOCUMENTS

| | | |
|---|---|---|
| 10,685,887 B2 | 6/2020 | Smith et al. |
| 10,756,096 B2 | 8/2020 | Paul et al. |
| 10,833,180 B2 | 11/2020 | Song et al. |
| 11,133,310 B2 | 9/2021 | Fulford et al. |
| 2006/0153995 A1 | 7/2006 | Narwankar et al. |
| 2007/0063296 A1 | 3/2007 | Choi et al. |
| 2008/0311746 A1 | 12/2008 | Dussarrat |
| 2009/0302369 A1 | 12/2009 | Guha et al. |
| 2015/0054029 A1 | 2/2015 | Jangjian et al. |
| 2016/0148934 A1 | 5/2016 | Ji et al. |
| 2016/0365455 A1 | 12/2016 | Nabatame et al. |
| 2020/0035493 A1* | 1/2020 | Clark ................ H01L 21/02362 |
| 2020/0119164 A1 | 4/2020 | Tsau et al. |
| 2020/0176446 A1 | 6/2020 | Franco et al. |
| 2020/0373300 A1 | 11/2020 | Zhang et al. |
| 2021/0189145 A1* | 6/2021 | Noh .................. C23C 16/45553 |
| 2021/0399104 A1* | 12/2021 | Chang ............... H01L 29/42364 |
| 2021/0407999 A1 | 12/2021 | Huang et al. |

FOREIGN PATENT DOCUMENTS

| | | |
|---|---|---|
| JP | 2020010033 A | 1/2020 |
| KR | 20090031103 A | 3/2009 |
| KR | 20110119356 A | 11/2011 |

OTHER PUBLICATIONS

Huang, C. Y., et al., "3-D Self-aligned Stacked NMOS-on-PMOS Nanoribbon Transistors for Continued Moore's Law Scaling", 2020 IEEE International Electron Devices Meeting (IEDM), 2020, pp. 20.6.1-20.6.4, doi: 10.1109/IEDM13553.2020.9372066.

Loubet, N., et al., "A Novel Dry Selective Etch of SiGe for the Enablement of High Performance Logic Stacked Gate-All-Around NanoSheet Devices", 2019 IEEE International Electron Devices Meeting (IEDM), 2019, pp. 11.4.1-11.4.4, doi: 10.1109/IEDM19573.2019.8993615.

PCT International Search Report and Written Opinion in PCT/US2022/015674 dated May 30, 2022, 10 pages.

* cited by examiner

MOSFET GATE ENGINEERINNG WITH DIPOLE FILMS

CROSS-REFERENCE TO RELATED APPLICATIONS

This application claims priority to U.S. Provisional Application No. 63/283,205, filed Nov. 24, 2021, and U.S. Provisional Application No. 63/147,217, filed Feb. 8, 2021, the entire disclosures of which are hereby incorporated by reference herein.

TECHNICAL FIELD

Embodiments of the present disclosure generally relate dipole regions comprising niobium, which are formed from a niobium-based dipole film. In particular embodiments, high-κ metal gate (HKMG) stacks include a high-κ metal oxide layer comprising a dipole region, and work function materials for PMOS (positive metal-oxide-semiconductor).

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

As device dimensions have shrunk, device geometries and materials have experienced difficulty maintaining switching speeds without incurring failures. Several new technologies have emerged that allow chip designers to continue shrinking device dimensions. Control of the dimensions of device structure is a key challenge for present and future technology generations.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET. A gate electrode is part of an integrated circuit. For example, a MOSFET comprises a gate structure disposed between source and drain regions that are formed in the semiconductor substrate. The gate structure or stack generally comprises a gate electrode and a gate dielectric. The gate electrode is disposed over the gate dielectric to control a flow of charge carriers in a channel region that is formed between drain and source regions beneath the gate dielectric.

Threshold voltages ($V_t$) in MOSFETs are conventionally modulated by inserting an interface dipole layer in a high-K/metal gate stack or adding a work function adjusting layer to a gate electrode. However, the conventional $V_t$ modulation methods may be incompatible with architectures for the sub 10-15 nm technology nodes.

Accordingly, there is a need for systems and methods that can provide devices with modulated threshold voltages ($V_t$) as devices get smaller.

SUMMARY

One or more embodiments of the disclosure are directed to a metal gate stack on a substrate. The metal gate stack comprises: a positive metal-oxide-semiconductor (PMOS) work function material above a high-κ metal oxide capping layer, a high-κ metal oxide layer, and an interfacial layer, and below a gate electrode, the high-κ metal oxide layer comprising a dipole region adjacent to the interfacial layer, the dipole region comprising niobium (Nb). The metal gate stack has a threshold voltage ($V_t$) improved relative to a metal gate stack comprising a comparative high-κ metal oxide layer without the dipole region.

Additional embodiments of the disclosure are directed to metal gate stack on a substrate comprising: an interfacial layer on the substrate; a high-κ metal oxide layer on the interfacial layer, the high-κ metal oxide layer comprising a dipole region adjacent to the interfacial layer, the dipole region comprising niobium (Nb); a high-κ metal oxide capping layer on the high-κ metal oxide layer; a positive metal-oxide-semiconductor (PMOS) work function material above the high-κ metal oxide capping layer; and a gate electrode above the PMOS work function material.

Further embodiments of the disclosure are directed to method of forming a dipole region, the method comprising: preparing an interfacial layer on a surface of a substrate; depositing a high-κ metal oxide layer on the interfacial layer; preparing a dipole film on the high-κ metal oxide layer by exposing the surface of the substrate to a first precursor comprising niobium and optionally to a second precursor comprising nitrogen, oxygen, or carbon using atomic layer deposition at a first substrate temperature in a range of 350° C. to 500° C.; depositing a first high-κ metal oxide capping layer on the substrate; and exposing the substrate to a thermal treatment at a second substrate temperature of at least 700° C. to drive the dipole film into the high-κ metal oxide layer and to form the dipole region comprising niobium adjacent to the interfacial layer. The methods may further comprise comprising removing any remaining portion of the dipole film and the first high-κ metal oxide capping layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
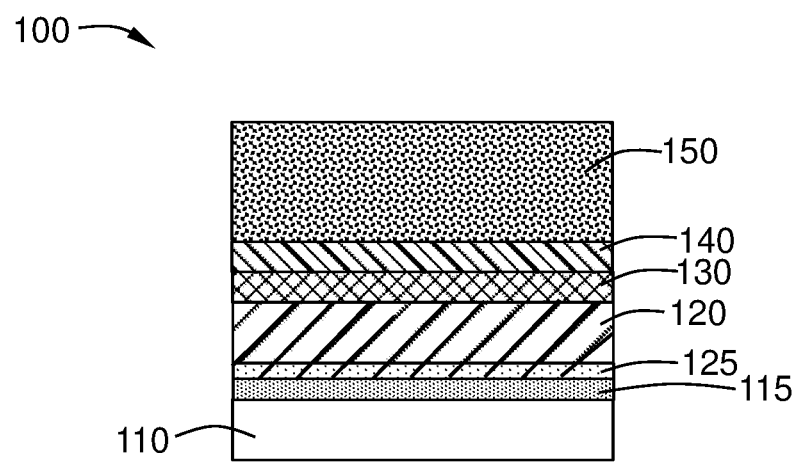
FIG. 1 is a cross-sectional view of a metal gate stack in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to metal gate stacks with excellent PMOS performance, e.g., improved threshold voltage ($V_t$). Some embodiments of this disclosure provide metal gate stacks whose high-κ metal oxide layer comprises a dipole region including niobium (Nb) and/or titanium (Ti) with a $V_t$ improved relative to comparative metal gate stacks without such a dipole region. In some embodiments, the Ti and/or Nb is provided to the dipole region by driving a niobium-based film into the high-κ metal oxide layer.

Experiments directed to $V_t$ performance for Nb-containing dipole regions showed improvements of $V_t$ of greater than or equal+100 mV and no equivalent oxide thickness (EOT) penalty (<~0.2 Å). In an experiment, the niobium nitride (NbN) film was deposited by atomic layer deposition using precursors of $NbCl_5$ and $NH_3$ at a substrate temperature of 450° C. onto a high-κ metal oxide layer comprising hafnium oxide ($HfO_2$), which was located on an interfacial layer of $SiO_2$ on a substrate. A TiN high-κ metal oxide capping layer was deposited in situ on the niobium-based film using PVD. The NbN film was driven into the high-κ metal oxide layer by a thermal treatment at a substrate temperature of at least 700° C.

Advantageously, deposition of NbN and/or TiN by ALD was a linear process with stable and uniform growth. Also advantageously, step coverage on a silicon dioxide surface is greater than or equal to 95%.

One or more embodiments of the present disclosure provide devices and methods of formation that are particularly useful in forming positive metal oxide semiconductor (PMOS) integrated-circuit devices and will be described in that context. Other devices and applications are also within the scope of the invention.

FIG. 1 illustrates a cross sectional view of an exemplary PMOS metal gate stack device 100. Device 100 comprises a substrate 110 whose surface is oxidized for form an interfacial layer 115. In some embodiments, the substrate 110 comprises silicon and the interfacial layer 115 comprises silicon dioxide. In some embodiments, the substrate comprises additional electric elements and materials including but not limited to source regions, drain regions, conductive channels, and other electrical connectors.

According to one or more embodiments, the PMOS metal gate stack device 100 comprises a gate dielectric or high-κ metal oxide layer 120 having a dipole region 125, a high-κ metal oxide capping layer 130, and a metal gate work function layer 140. As used herein, the metal gate work function layer 140 may also be referred to as a "PMOS work function material". The dipole region 125 is in the high-κ metal oxide layer 120 adjacent to the interfacial layer 115.

The high-κ metal oxide layer 120 electrically insulates the metal gate work function layer 140 from the substrate 110. The high-κ metal oxide layer 120 and metal gate work function layer 140 together may be referred to herein as a metal gate stack. In some embodiments, the metal gate stack further comprises a gate electrode 150 on the metal gate work function layer 140.

In some embodiments, the gate dielectric 120 comprises a metal oxide. In some embodiments, the gate dielectric 120 comprises hafnium oxide ($HfO_2$).

In some embodiments, the high-κ capping layer 130 comprises or consists essentially of TiN. In some embodiments, the high-κ capping layer comprises or consists essentially of TiSiN. As used in this regard, "consists essentially of" means that the stated elements compose greater than 95%, greater than 98%, greater than 99% or greater than 99.5% of the stated material on an atomic basis. For the avoidance of doubt, no stoichiometric ratios are implied by the identification of materials disclosed herein. For example, a TiN material contains titanium and nitrogen. These elements may or may not be present at a 1:1 ratio.

The high-κ capping layer 130 may have any suitable thickness. In some embodiments, the thickness of the high-κ capping layer 130 is in a range of greater than or equal to 5 Å to less than or equal to 25 Å. In some embodiments, the thickness of the high-κ capping layer is about 10 Å, which includes 10 Å±10%, 10 Å±5%, and/or 10 Å±1%.

In some embodiments, the high-κ capping layer 130 comprises or consists essentially of TiN. In some embodiments, the high-k capping layer 130 comprises or consists essentially of TiSiN.

The PMOS work function material 140 comprises any suitable material. The PMOS work function material 140 may have any suitable thickness. In some embodiments, the thickness of the PMOS work function material 140 is in a range of greater than or equal to 5 Å to less than or equal to 50 Å. In some embodiments, the thickness of the metal gate work function layer is about 15 Å, which includes 15 Å±10%, 15 Å±5%, and/or 15 Å±1%.

In some embodiments, the metal gate stack device 100 further comprises a gate electrode 150. The gate electrode 150 may comprise multiple layers. In some embodiments, the gate electrode 150 comprises a first layer comprising TiAl and a second layer comprising TiN. In some embodiments, the first layer has a thickness of greater than or equal to 20 Å to less than or equal to 30 Å. In some embodiments, the first layer has a thickness of about 25 Å, which includes 25 Å±10%. In some embodiments, the second layer has a thickness of about 500 Å, which includes 500 Å±10%, 500 Å±5%, and/or 500 Å±1%. The first layer and the second layer may be deposited by any suitable method.

Threshold voltage ($V_t$) provides a characteristic of the metal gate stack. Including a Nb-containing dipole region (or Ti-containing dipole region) in a high-κ metal oxide layer of a metal gate stack increases $V_t$. In one or more embodiments, when the high-κ metal oxide layer 120 comprises $HfO_2$ and a Nb-containing dipole region (or Ti-containing dipole region), $V_t$ increases by greater than or equal to +100 mV.

Equivalent oxide thickness (EOT) provides a characteristic of the metal gate stack. In one or more embodiments, a metal gate stack comprising a Nb-containing dipole region (or Ti-containing dipole region) formed from a NbN dipole film (or TiN dipole film) has an EOT that is less than or equal to ~0.2 Å relative to a comparative metal gate stack without a Nb-containing dipole region (or TiN dipole region).

In some embodiments, the p dipole metal comprises or consists essentially of titanium aluminum nitride (TiAlN). In some embodiments, the p dipole capping layer comprises or consists essentially of titanium silicon nitride (TiSiN). In some embodiments, there is no intentional air break between TiAlN and TiSiN deposition. In some embodiments, there is no amorphous silicon capping layer before annealing the p dipole layer and the p dipole cap.

Figure 2:
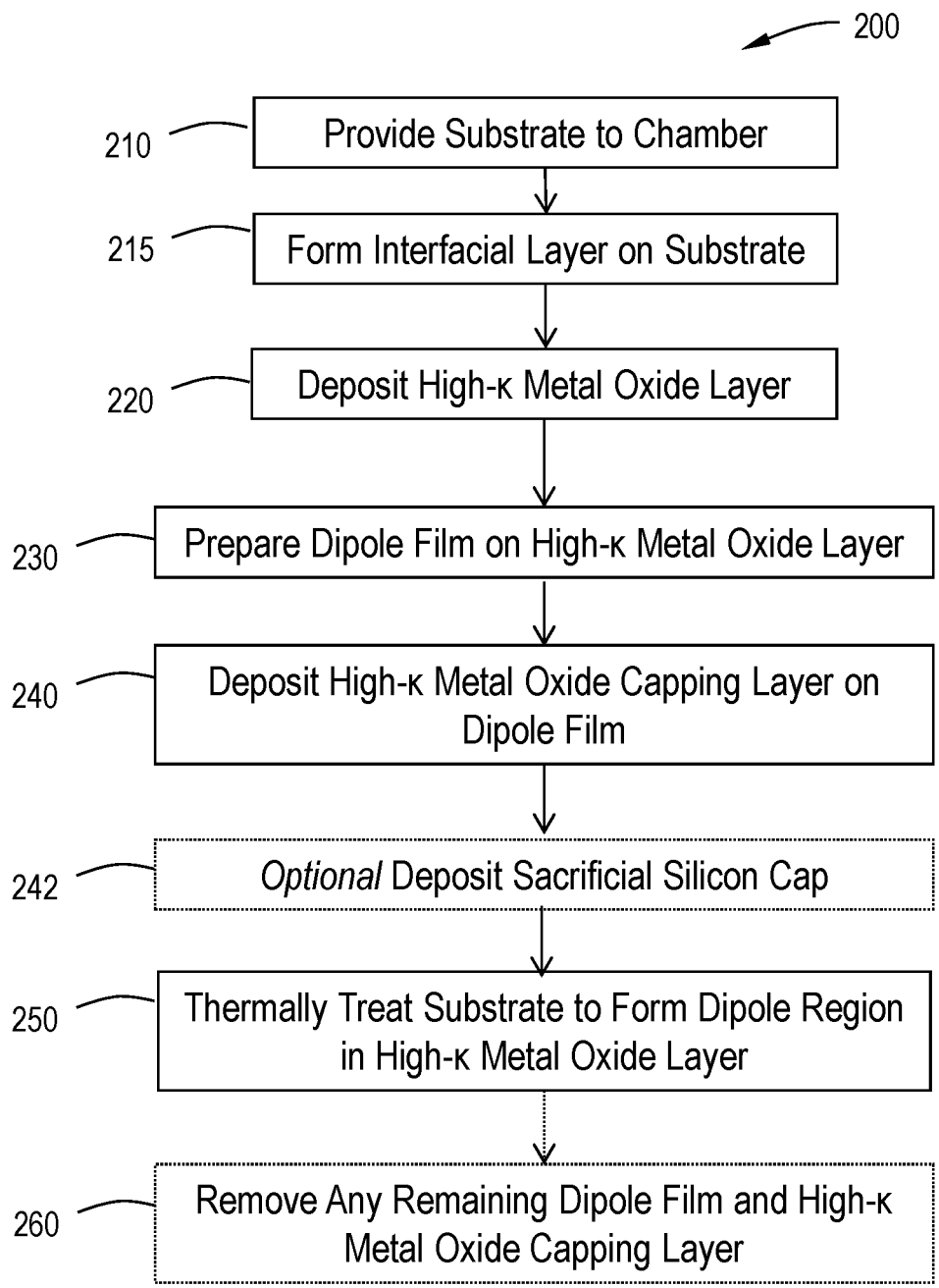
FIG. 2 is a flowchart of a method of forming a dipole region in accordance with one or more embodiments of the disclosure.

Referring to FIG. 2, another embodiment of the disclosure relates to a method 200 of forming a dipole region. The method 200 starts at operation 210 by providing a substrate to a processing chamber.

At operation 215, an interfacial layer is formed on the substrate. Formation of the interfacial layer may include a suitable thermal oxidation process, such as an enhanced in-situ steam generation (eISSG) process utilizing nitrous oxide ($N_2O$) gas. In one or more embodiments, the interfacial layer (e.g., 115 of FIG. 1) is a thin amorphous silicon oxide ($SiO_2$) layer, having a thickness of between about 3 Å and about 10 Å, for example, about 5 Å, corresponding to one or more monolayers of silicon oxide. In some embodiments, the interfacial layer may be formed by an in-situ steam generation (ISSG) process utilizing $H_2$ and $O_2$ gases, or a rapid thermal oxidation (RTO) process utilizing $NH_3$ and $O_2$ gases. The interfacial layer may act as a nucleation layer of the high-κ gate dielectric layer (e.g., 120 of FIG. 1) to be deposited thereon.

At operation 220, a high-κ metal oxide layer is deposited on the interfacial layer. The high-κ gate metal oxide layer may be formed of high-κ dielectric material, such as hafnium dioxide ($HfO_2$), zirconium dioxide ($ZrO_2$), ytterbium oxide ($Y_2O_3$), aluminum oxide ($Al_2O_3$), ternary high-κ dielectric film with the third element doped into the existing metal oxide high-κ dielectric host material, such as HfZrO, HfLaOx, HfTiO. The deposition process may include an atomic layer deposition (ALD) process, in which a metal-containing precursor and an oxygen-containing precursor are alternately delivered to the interfacial layer. In some embodiments, the metal-containing precursor is purged prior to delivering the oxygen-containing precursor. The metal may be a transition metal, such as hafnium (Hf), zirconium (Zr), or titanium (Ti), a rare-earth metal, such as lanthanum (La), ytterbium (Yb), or yttrium (Y), an alkaline earth metal, such as strontium (Sr), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the interfacial layer. In one example, the metal-containing precursor is hafnium tetrachloride ($HfCl_4$) and the oxidant is water ($H_2O$) to form a hafnium dioxide ($HfO_2$) layer. The ALD process may be performed at a temperature of between 200° C. and about 400° C., for example, about 270° C. The metal oxide layer, as deposited by the ALD process, may be amorphous and have a thickness of between about 10 Å and about 30 Å.

At operation 230, a dipole film is prepared on the high-κ metal oxide layer. In one or more embodiments, the dipole film is a niobium-containing film, for example, a niobium nitride (NbN) film (or titanium nitride film). The niobium-containing film (or titanium-containing film) is deposited by atomic layer deposition (ALD) at a substrate temperature in a range of 350° C. to 500° C. The ALD cycle is repeated to obtain a NbN film (or TiN film) of a desired thickness, for example 5 Å to 10 Å. In some embodiments, deposition of the dipole film is conducted by a blanket deposition of the dipole film over the entire exposed surface of the high-κ gate dielectric layer, and a subsequent lithography and etch process to pattern the dipole film (i.e., to form the dipole film in some regions of the semiconductor structure, and not in some other regions of the semiconductor structure). In a subsequent thermal treatment (at operation 250), for example, an anneal process, dopant species from the dipole film, e.g., Nb are diffused and incorporated into the underlying high-κ gate dielectric layer to form a dipole region.

In one or more embodiments, the dipole film is prepared on the high-κ metal oxide layer by exposing the surface of the substrate to a first precursor comprising niobium and optionally to a second precursor comprising nitrogen, oxygen, or carbon using atomic layer deposition at a first substrate temperature in a range of 350° C. to 500° C. In general, any suitable niobium precursor can be used. For a NbN film, niobium precursors can include, but are not limited to $NbCl_5$, $NbB_5$, $NbBr_5$, $NbI_5$, $NbF_5$, organic-niobium compounds, and combinations thereof; and nitrogen precursors can include but are not limited to: $NH_3$, $N_2$, $N_2H_2$, $N_2H_4$, nitrogen-containing plasma, and combinations thereof. In general, any suitable titanium precursor can be used. For a TiN film, titanium precursors can include, but are not limited to, $TiCl_5$, $TiBr_5$, $TiI_5$, $TiF_5$, organic-titanium compounds and combinations thereof; and nitrogen precursors can include but are not limited to $NH_3$, $N_2$, $N_2H_2$, $N_2H_4$, nitrogen-containing plasma, and combinations thereof.

In one or more embodiments, the first precursor comprises a first compound selected from the group consisting of: $NbCl_5$, $NbB_5$, $NbBr_5$, $NbI_5$, $NbF_5$, $NbOCl_3$, an organic-niobium compound, and combinations thereof. In one or more embodiments, the first precursor comprises a first compound selected from the group consisting of: $TiCl_5$, $TiB_5$, $TiBr_5$, $TiI_5$, $TiF_5$, $TiOCl_3$, an organic-niobium compound, and combinations thereof.

In one or more embodiments, the second precursor comprises a second compound selected from the group consisting of: $NH_3$, $N_2$, $N_2H_2$, $N_2H_4$, nitrogen-containing plasma, and combinations thereof.

In one or more embodiments, the second precursor comprises a second compound selected from the group consisting of $H_2O$, $H_2O_2$, $O_3$, ethanol, and combinations thereof.

In one or more embodiments, the second precursor comprises a second compound selected from the group consisting of: $CH_4$, ethanol, and $H_2$.

In one or more embodiments, the second precursor comprises a combination of two or more second compounds selected from the group consisting of: $NH_3$, $CH_4$, ethanol, $H_2$.

In one or more embodiments, the first precursor comprises NbCl$_5$ and the second precursor comprises NH$_3$. In one or more embodiments, the first precursor comprises TiCl$_5$ and the second precursor comprises NH$_3$.

At operation 240, a high-κ metal oxide capping layer is deposited on the dipole film. In one or more embodiments, the high-κ metal oxide capping layer is deposited by atomic layer deposition (ALD). In one or more embodiments, the high-κ metal oxide capping layer comprises titanium nitride (TiN). An exemplary process for depositing TiN includes: exposing the substrate to a first precursor comprising Ti, and then to a second precursor comprising a nitrogen source to provide a TiN film. In some embodiments, the substrate is exposed to the precursors repeatedly to obtain a predetermined film thickness. In some embodiments, the substrate is maintained a temperature of about 200° C. to about 700° C. during the ALD process.

At optional operation 245, a sacrificial silicon cap layer comprising an amorphous silicon (a-Si) material is deposited onto the substrate. The sacrificial silicon cap layer may physically and chemically protect the underlying high-κ metal oxide layer and the first high-κ metal oxide capping layer during a subsequent thermal treatment process at operation 250. The sacrificial silicon cap layer is formed of amorphous silicon, such as hydrogenated amorphous silicon (a-Si:H). Amorphous silicon may provide less diffusion of atoms as compared to polycrystalline silicon which include grain boundaries leading path for diffusion. The deposition process in block 245 may be an atomic layer deposition (ALD) process or a chemical vapor deposition (CVD) process, in which the semiconductor structure having the first high-κ metal oxide capping layer formed thereon is exposed to a silicon precursor. Examples of the silicon precursors are poly-silanes (SixHy). For example, poly-silanes include disilane (Si$_2$H$_6$), trisilane (Si$_3$H$_8$), tetrasilane (Si$_4$H$_{10}$), isotetrasilane, neopentasilane (Si$_5$H$_{12}$), cyclopentasilane (Si$_5$H$_{10}$), hexasilane (C$_6$H$_{14}$), cyclohexasilane (Si$_6$H$_{12}$) or, in general, SixHy with x=2 or more, and combinations thereof. The sacrificial silicon cap layer may have a thickness of between about 30 Å and about 50 Å.

At operation 250, the substrate is thermally-treated to drive the dipole film into the high-κ metal oxide layer and to form a dipole region in the high-κ metal oxide layer. Thermal treatment is performed to cause the niobium (Nb) dopant species (or titanium dopant species) to diffuse into the underlying high-κ gate metal oxide layer. In one or more embodiments, the thermal treatment of operation 250 comprises a post cap anneal (PCA) process, which is performed to harden and densify the first high-κ metal oxide capping layer. Crystallization of the as-deposited first high-κ metal oxide capping layer and any as-deposited sacrificial silicon cap layer may occur. The PCA process may comprise an anneal process. The anneal process may include a thermal anneal process in an inert ambient, such as in a nitrogen (N$_2$) and argon (Ar) ambient, performed in a rapid thermal processing (RTP) chamber, such as RADOX™ chamber, available from Applied Materials, Inc., located in Santa Clara, Calif.

The thermal treatment of operation 250 may be performed for between about 1 second and about 30 seconds, at a temperature of between about 600° C. and about 1000° C., for example, about 900° C. and at a pressure of between about 0.1 Torr and 100 Torr.

At operation 260, according to one or more embodiments, any remaining portion of the dipole film along with the high-κ metal oxide capping layer is removed. The removal process may include a dry plasma etch process. The resulting structure including a high-κ metal oxide layer with a doped region can then be further processed to fit desired applications.

Aspects herein comprise: a method of forming a dipole region, the method comprising: preparing an interfacial layer on a surface of a substrate; depositing a high-κ metal oxide layer on the interfacial layer; preparing a dipole film on the high-κ metal oxide layer by exposing the surface of the substrate to a first precursor comprising niobium (or titanium) and optionally to a second precursor comprising nitrogen, oxygen, or carbon using atomic layer deposition at a first substrate temperature in a range of 350° C. to 500° C.; depositing a first high-κ metal oxide capping layer on the substrate; and exposing the substrate to a thermal treatment at a second substrate temperature of at least 700° C. to drive the dipole film into the high-κ metal oxide layer and to form the dipole region comprising niobium (or titanium) adjacent to the interfacial layer.

In one or more embodiments, the method further comprises removing any remaining portion of the dipole film and the first high-κ metal oxide capping layer.

Figure 3:
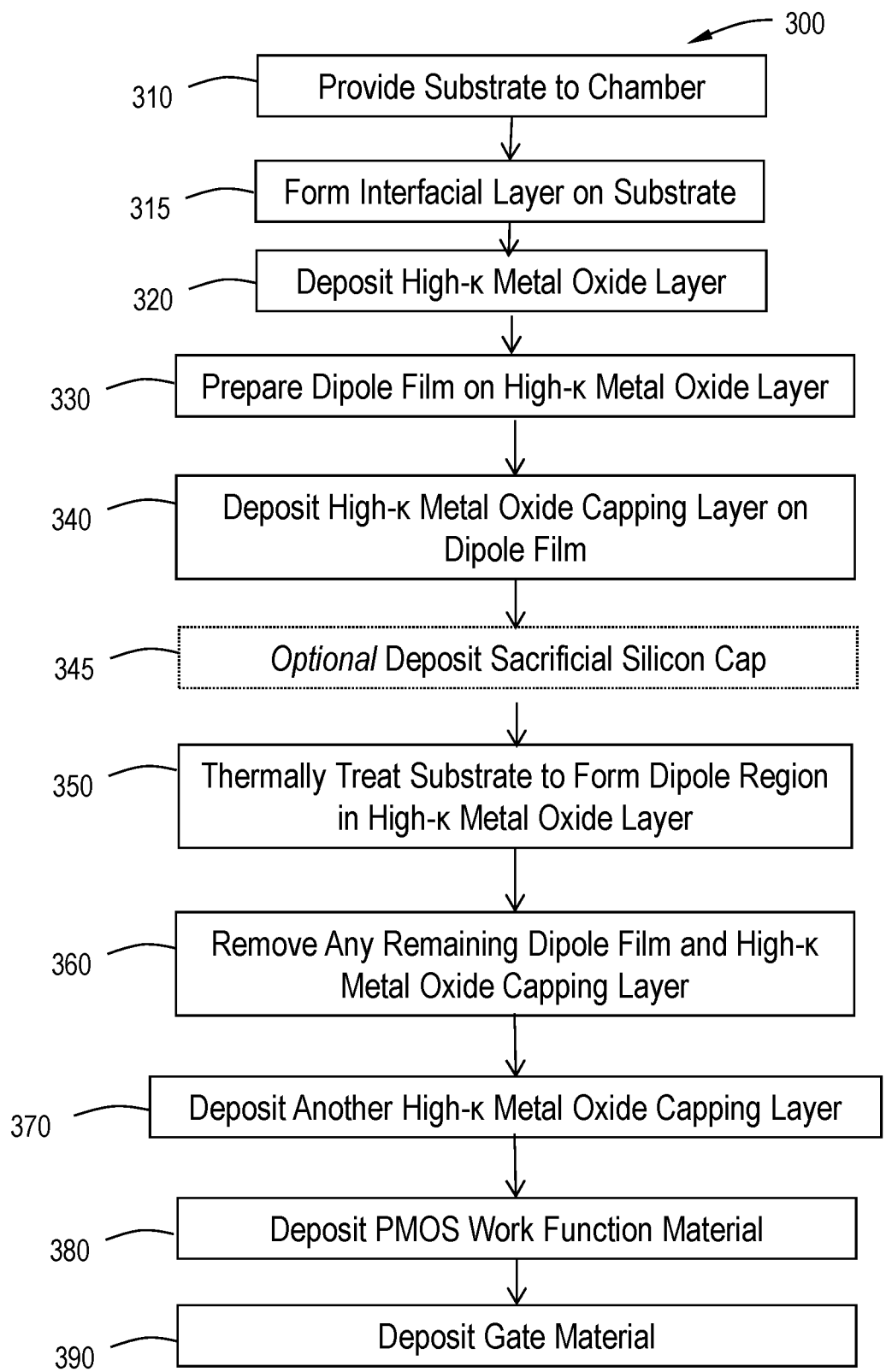
FIG. 3 is a flowchart of a method for forming a metal gate stack according to FIG. 1 in accordance with one or more embodiments of the disclosure.

Referring to FIG. 3, another embodiment of the disclosure relates to a method 300 of forming metal gate stack device 100. The method 300 starts at 310 by providing a substrate within a first processing chamber. At operation 315, an interfacial layer is formed on the substrate, and is in accordance with operation 215 discussed with respect to FIG. 2. At operation 320, a high-κ metal oxide layer is deposited on the interfacial layer, and is in accordance with operation 220 discussed with respect to FIG. 2. At operation 330, a dipole film is prepared on the high-κ metal oxide layer, and is in accordance with operation 230 discussed with respect to FIG. 2. At operation 340, a high-κ metal oxide capping layer is deposited on the dipole film, and is in accordance with operation 240 discussed with respect to FIG. 2.

In one or more embodiments, the high-κ metal oxide capping layer is deposited on the dipole film in situ, in that the same processing (first) chamber is used for both operations 330 and 340.

At optional operation 345, a sacrificial silicon cap layer comprising an amorphous silicon (a-Si) material is deposited onto the substrate, and is in accordance with operation 245 discussed with respect to FIG. 2.

After deposition of the high-κ metal oxide capping layer, according to one or more embodiments, the substrate is transferred to a different (second) processing chamber for operation 350. In some embodiments, the first processing chamber and the second processing chamber are integrated. In some embodiments, the method 300 is performed without breaking vacuum or without exposure to ambient air.

At operation 350, the substrate is thermally-treated to drive the dipole film into the high-κ metal oxide layer and to form a dipole region in the high-κ metal oxide layer. At operation 360, any remaining portion of the dipole film along with the high-κ metal oxide capping layer is removed. Thereafter at operation 370, another (second) high-κ metal oxide capping layer is deposited on the high-κ metal oxide layer. At operation 380, PMOS work function material is deposited on the second high-κ metal oxide capping layer. At operation 390, a gate material is deposited on the PMOS work function material.

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and inorganic/halide compounds.

In general, any suitable titanium precursor can be used for the high-κ capping layer. Thus, titanium precursors can include, but are not limited to TiCl$_4$, TiBr$_4$, TiI$_4$, TiF$_4$, tetrakisdimethylamino titanium. Additionally, any suitable nitrogen source precursor can be used. Examples include, but are not limited to, nitrogen gas, ammonia gas, N$_2$H$_2$ or N$_2$H$_4$.

Aspects herein are directed to a method of manufacturing a metal gate stack, the method comprising: preparing an interfacial layer on a surface of a substrate in a first processing chamber; depositing a high-κ metal oxide layer on the interfacial layer within the first processing chamber; preparing a dipole film on the high-κ metal oxide layer by exposing the surface of the substrate to a first precursor comprising niobium (or titanium) and optionally to a second precursor comprising nitrogen, oxygen, or carbon within the first processing chamber using atomic layer deposition at a first substrate temperature in a range of 350° C. to 500° C.; depositing a first high-κ metal oxide capping layer on the substrate within the first processing chamber; transferring the substrate to a second processing chamber; exposing the substrate to a thermal treatment at a second substrate temperature in a range of 700° C. to 1050° C. in the second processing chamber to drive the dipole film into the high-κ metal oxide layer and to form a dipole region comprising niobium (or titanium) adjacent to the interfacial layer; and removing the first high-κ metal oxide capping layer and any remaining portion of the dipole film.

In one or more embodiments, the method further comprises depositing a second high-κ metal oxide capping layer on the substrate.

In one or more embodiments, the method further comprises depositing a PMOS work function material on the substrate.

In one or more embodiments, the method further comprises depositing a gate material on the substrate.

In one or more embodiments, the first high-κ metal oxide capping layer comprises titanium nitride (TiN), the high-κ metal oxide layer comprises hafnium oxide (HfO$_2$), and the interfacial layer comprises silicon dioxide (SiO$_2$).

In one or more embodiments, the method further comprises the second high-κ metal oxide capping layer comprises TiN.

In one or more embodiments, preparing the interfacial layer comprises oxidizing the surface of the substrate before depositing the high-κ metal oxide layer.

The order in which the substrate is exposed to the precursors can be varied. The exposures may repeat in a deposition cycle. Further, exposure to a precursor may be repeated within a single deposition cycle.

In some embodiments, the process for forming a MOSFET comprises 1) forming a gate dielectric (e.g., interlayer dielectric/high-k dielectric); 2) depositing a p-dipole metal layer comprising TiAlN deposited on the gate dielectric by ALD, or other process; 3) transfer the wafer from the ALD chamber to include an intentional airbreak in order to allow oxygen to react with the TiAlN; 4) depositing a dipole capping layer comprising TiSiN by ALD, or other technique; 5) thermal anneal by RTP at 700-900 C (without a-Si cap); and 6) stripping of the capping layers.

Some embodiments of the disclosure are directed to metal gate stacks on a substrate comprising: a positive metal-oxide-semiconductor (PMOS) work function material above a high-κ metal oxide capping layer, a high-κ metal oxide layer, and an interfacial layer, and below a gate electrode, the high-κ metal oxide layer comprising a dipole region adjacent to the interfacial layer, the dipole region comprising titanium aluminum nitride (TiAlN), wherein the metal gate stack has a threshold voltage (Vt) improved relative to a metal gate stack comprising a comparative high-κ metal oxide layer without the dipole region.

Additional embodiments of the disclosure are directed to methods of forming a dipole region. The methods comprise: preparing an interfacial layer on a surface of a substrate; depositing a high-κ metal oxide layer on the interfacial layer; preparing a dipole film on the high-κ metal oxide layer by exposing the surface of the substrate to a first precursor comprising titanium and optionally to a second precursor comprising nitrogen, oxygen, or carbon using atomic layer deposition at a first substrate temperature in a range of 350° C. to 500° C., the dipole film comprising TiAlN; depositing a first high-κ metal oxide capping layer on the substrate, the capping layer comprising TiSiN; and exposing the substrate to a thermal treatment at a second substrate temperature of at least 700° C. to drive the dipole film into the high-κ metal oxide layer and to form the dipole region comprising titanium adjacent to the interfacial layer Methods of this disclosure can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

In some embodiments, the first processing chamber and the second processing chamber are part of the same, clustered, processing tool. Accordingly, in some embodiments, the method is an in-situ integrated method.

In some embodiments, the first processing chamber and the second processing chamber are different processing tools. Accordingly, in some embodiments, the method is an ex-situ integrated method.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, and/or cleaning processes throughout the carousel path.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited.

Furthermore, a lot of time can be used to purge a chamber, and therefore throughput can be increased by eliminating the purge step.

Figure 4:
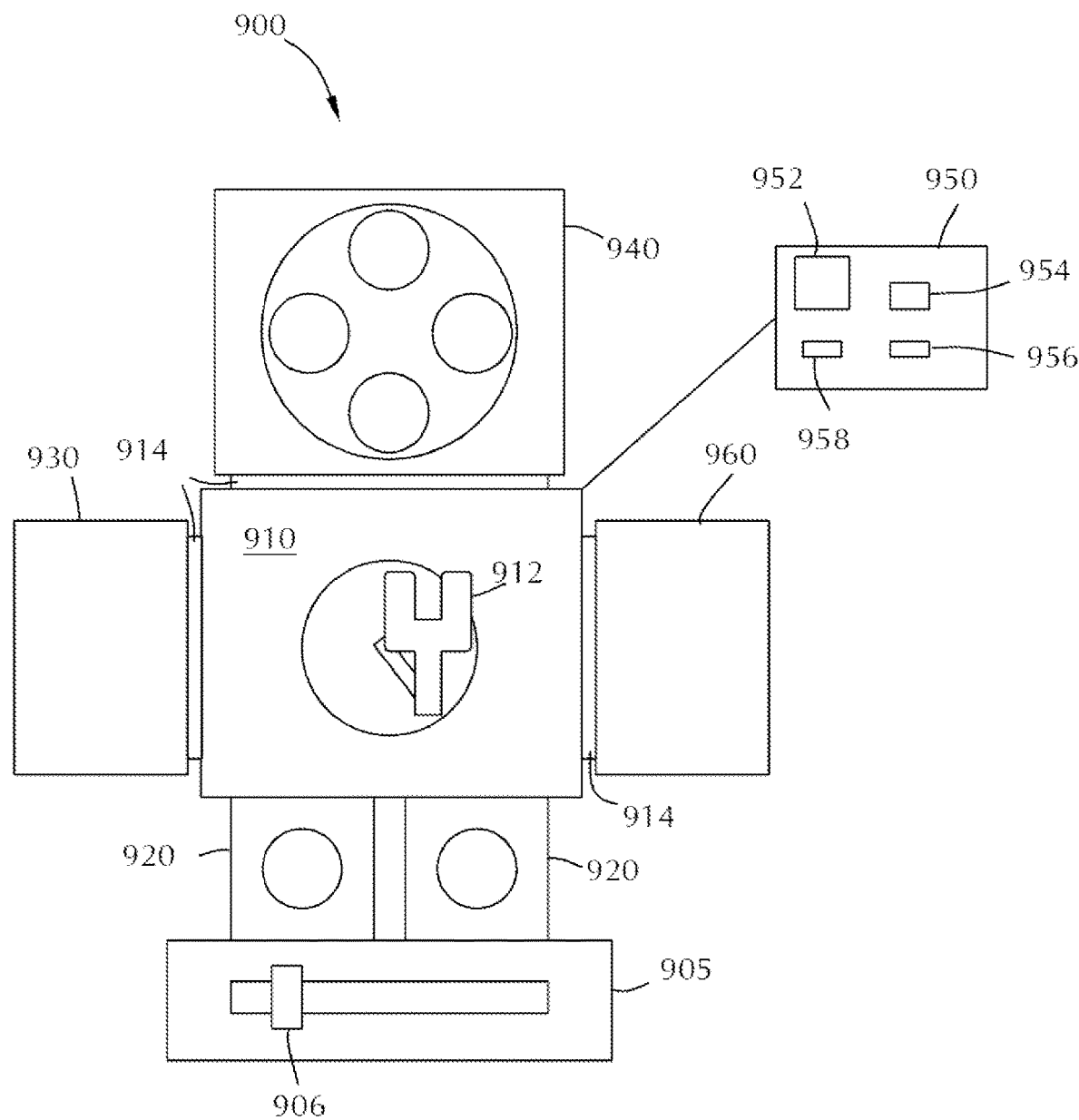
FIG. 4 is a cluster tool accordance with one or more embodiments of the disclosure.

With reference to FIG. 4, additional embodiments of the disclosure are directed to a processing system 900 for executing the methods described herein. FIG. 4 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured for thermal oxidation to form an interfacial layer on the substrate. The substrate can be moved to and from the processing chamber 930 by the robot 912 passing through isolation valve 914.

Processing chamber 940 can also be connected to the central transfer station 910. In some embodiments, processing chamber 940 comprises an atomic layer deposition chamber for depositing a high-κ gate metal oxide layer and is fluid communication with one or more reactive gas sources to provide flows of reactive gas to the processing chamber 940. In some embodiments, processing chamber 940 comprises an atomic layer deposition chamber for depositing a dipole film and is fluid communication with one or more reactive gas sources to provide flows of reactive gas to the processing chamber 940. In some embodiments, processing chamber 940 comprises an atomic layer deposition chamber for depositing a high-κ gate metal oxide capping layer and is fluid communication with one or more reactive gas sources to provide flows of reactive gas to the processing chamber 940. The substrate can be moved to and from the processing chamber 940 by robot 912 passing through isolation valve 914.

In some embodiments, processing chamber 960 is connected to the central transfer station 910 and is configured to thermally treat the substrate.

In some embodiments, other processing chambers may be configured to perform further portions of the processing method including removing any remaining dipole film and the first high-κ metal oxide capping layer; depositing the second high-κ capping layer; depositing the PMOS work function material; depositing gate electrode material. The skilled artisan will recognize that the number and arrangement of individual processing chamber on the tool can be varied and that the embodiment illustrated in FIG. 4 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to form an interfacial layer on a surface of a substrate; a configuration to deposit a high-κ metal oxide layer; a configuration to deposit a Nb-containing (e.g. NbN) film; a configuration to deposit a first high-κ metal oxide capping layer; a configuration to thermally treat the substrate and drive the Nb-containing film into the high-κ metal oxide layer; a configuration to remove any remaining Nb-containing film and the first high-κ metal oxide capping layer; a configuration to deposit a second high-κ metal oxide capping layer; a configuration to deposit a PMOS work function material; and/or a configuration to deposit a gate electrode.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a dipole region, the method comprising:
   preparing an interfacial layer on a surface of a substrate;
   depositing a high-metal oxide layer on the interfacial layer;
   preparing a dipole film on the high-K metal oxide layer by exposing the surface of the substrate to a first precursor selected from the group consisting of $NbCl_5$, $NbB_5$, $NbBr_5$, $NbI_5$, $NbF_5$, $NbOCl_3$, and combinations thereof and a second precursor comprising nitrogen, oxygen, of one or more of $CH_4$ or ethanol using atomic layer deposition at a first substrate temperature in a range of 350° C. to 500° C.;
   depositing a first high-K metal oxide capping layer on the substrate; and
   exposing the substrate to a thermal treatment at a second substrate temperature of at least 700° C. to drive the dipole film into the high-K metal oxide layer and to form the dipole region comprising niobium adjacent to the interfacial layer.

2. The method of claim 1, further comprising removing any remaining portion of the dipole film, and the first high-K metal oxide capping layer.

3. The method of claim 2, further comprising depositing a second high-K metal oxide capping layer on the substrate after removing the first high-K metal oxide capping layer, and any remaining portion of the dipole film.

4. The method of claim 1, wherein the first high-K metal oxide capping layer comprises titanium nitride (TIN), the high-K metal oxide layer comprises hafnium oxide ($HfO_2$), and the interfacial layer comprises silicon dioxide ($SiO_2$).

5. The method of claim 4, wherein the second precursor further comprises a second compound selected from the group consisting of: $NH_3$, $N_2$, $N_2H_2$, $N_2H_4$, nitrogen-containing plasma, and combinations thereof.

6. The method of claim 4, wherein the second precursor further comprises a second compound selected from the group consisting of $H_2O$, $H_2O_2$, $O_3$, ethanol, and combinations thereof.

7. The method of claim 4, wherein the first precursor comprises $NbCl_5$ and the second precursor further comprises $NH_3$.

8. The method of claim 4, wherein depositing the first high-κ metal oxide capping layer and preparing the dipole film on the high-K metal oxide layer are both conducted in a first chamber.

9. The method of claim 3, further comprising depositing a PMOS work function material on the substrate.

10. The method of claim 9, further comprising depositing a gate material on the substrate.

* * * * *

UNITED STATES PATENT AND TRADEMARK OFFICE
CERTIFICATE OF CORRECTION

| | | |
|---|---|---|
| PATENT NO. | : 12,230,688 B2 | Page 1 of 1 |
| APPLICATION NO. | : 17/667036 | |
| DATED | : February 18, 2025 | |
| INVENTOR(S) | : Yong Yang et al. | |

It is certified that error appears in the above-identified patent and that said Letters Patent is hereby corrected as shown below:

On the Title Page

Item (54), Column 1, Line 1, after "MOSFET GATE", replace "ENGINEERINNG" with "ENGINEERING".

In the Specification

Column 1, Line 1, after "MOSFET GATE", replace "ENGINEERINNG" with "ENGINEERING".
Column 10, Line 4, after "threshold voltage", replace "(Vt)" with "($V_t$)".
Column 10, Line 23, after "interfacial layer", add ".".
Column 14, Line 8, after "Nb-containing", replace "(e.g. NbN)" with "(e.g., NbN)".

In the Claims

Column 14, Claim 1, Line 46, replace "high-metal" with "high-κ metal".
Column 14, Claim 1, Line 48, replace "high-K metal" with "high-κ metal".
Column 14, Claim 1, Line 52, delete "nitrogen, oxygen, of".
Column 14, Claim 1, Line 56, replace "high-K metal" with "high-κ metal".
Column 14, Claim 1, Line 60, replace "high-K metal" with "high-κ metal".
Column 14, Claim 2, Lines 64-65, replace "high-K metal" with "high-κ metal".
Column 14, Claim 3, Line 67, replace "high-K metal" with "high-κ metal".
Column 15, Claim 3, Line 1, replace "high-K metal" with "high-κ metal".
Column 15, Claim 4, Line 3, replace "high-K metal" with "high-κ metal".
Column 15, Claim 4, Line 4, replace "(TIN)" with "(TiN)".
Column 15, Claim 4, Line 5, replace "high-K metal" with "high-κ metal".
Column 15, Claim 8, Line 20, replace "high-K metal" with "high-κ metal".

Signed and Sealed this
Twenty-second Day of April, 2025

Coke Morgan Stewart
*Acting Director of the United States Patent and Trademark Office*